United States Patent [19]

Joannopoulos et al.

[11] Patent Number: 5,784,400
[45] Date of Patent: Jul. 21, 1998

[54] RESONANT CAVITIES EMPLOYING TWO DIMENSIONALLY PERIODIC DIELECTRIC MATERIALS

[75] Inventors: John D. Joannopoulos, Belmont, Mass.; Robert D. Meade, Westfield, N.J.

[73] Assignee: Massachusetts Institute of Technology, Cambridge, Mass.

[21] Appl. No.: 395,441

[22] Filed: Feb. 28, 1995

[51] Int. Cl.$^6$ .................................................. H01S 3/08
[52] U.S. Cl. ........................... 372/96; 372/92; 372/50; 372/99
[58] Field of Search ............................. 372/96, 39, 49, 372/99, 92, 50; 343/909; 359/344

[56] References Cited

U.S. PATENT DOCUMENTS

| | | |
|---|---|---|
| 4,015,893 | 4/1977 | Sugano et al. . |
| 4,503,447 | 3/1985 | Iafrate et al. . |
| 4,591,889 | 5/1986 | Gossard et al. . |
| 4,799,749 | 1/1989 | Börner et al. . |
| 4,817,102 | 3/1989 | Maurer et al. . |
| 4,983,540 | 1/1991 | Yamaguchi et al. . |
| 4,999,682 | 3/1991 | Xu et al. . |
| 5,079,594 | 1/1992 | Mitsuyu et al. . |
| 5,126,804 | 6/1992 | Nagai et al. . |
| 5,155,567 | 10/1992 | Haga et al. . |
| 5,166,826 | 11/1992 | Ruprecht . |
| 5,172,267 | 12/1992 | Yablonovitch . |
| 5,187,461 | 2/1993 | Brommer et al. . |
| 5,210,801 | 5/1993 | Fournier et al. . |
| 5,236,547 | 8/1993 | Takahashi et al. . |
| 5,332,681 | 7/1994 | Tonucci et al. . |
| 5,335,240 | 8/1994 | Ho et al. ................................. 372/39 |
| 5,389,943 | 2/1995 | Brommer et al. .................... 343/909 |
| 5,440,421 | 8/1995 | Fan et al. ............................. 359/344 |

FOREIGN PATENT DOCUMENTS

WO 94/16345  7/1994  WIPO .

OTHER PUBLICATIONS

Semiconductor Science and Technology, vol. 9, No. 8, Aug. 1994, pp. 1493–1499, "Three–level laser based on intersubband transitions in asymmetric quantum wells: a theoretical study", By V. Berger.

Journal of Applied Physics, vol. 75, No. 9, May 1, 1994, pp. 4753–4755, "Novel applications of photonic band gap materials: Low loss bends and high Q cavities" By Robert D. Meade et al.

Physical Review A, vol. 48, No. 3, Sep. 1993, pp. 2246–2250, "Impurity modes in one–dimensional periodic systems: The transition from photonic band gaps to microcavities" By R. P. Stanley et al.

Applied Physics Letters, vol. 65, No. 5, Aug. 1, 1994, pp. 645–647, "Experimental and theoretical results for a two–dimensional metal photonic band–gap cavity" By D. R. Smith et al.

Ho, K.M., C.T. Chan, C.M. Soukoulis, R. Biswas and M. Sigalas, "Photonic Band Gaps in Three Dimensions: New Layer–By–Layer Periodic Structures", *Solid State Communications*, vol. 89, No. 5, 1994, pp. 413–416. No month available.

Kleinman, Leonard and D.M. Bylander, "Efficacious Form for Model Pseudopotentials", *Physical Review Letters*, vol. 48, No. 20, May 17, 1982, pp. 1425–1428.

(List continued on next page.)

*Primary Examiner*—Rodney B. Bovernick
*Assistant Examiner*—Yisun Song
*Attorney, Agent, or Firm*—Samuels, Gauthier, Stevens & Reppert

[57] ABSTRACT

The present invention provides a resonant cavity including a planar two-dimensional periodic dielectric structure which exhibits a photonic band gap and a defect in the periodic dielectric structure which results in an electromagnetic mode within the photonic band gap. The photonic band gap effects an in-plane spacial confinement of electromagnetic radiation generated within the structure. The electromagnetic radiation is vertically confined by total internal reflection.

20 Claims, 7 Drawing Sheets

OTHER PUBLICATIONS

Özbay, E., E. Michel and G. Tuttle, R. Biswas, M. Sigalas and K.M. Ho, "Micromachined Millimeter–Wave Photonic Band–Gap Crystals", *Appl. Phys. Lett.*, vol. 64, No. 16, Apr. 18, 1994, pp. 2059–2061.

Sözüer, H.S. and Jonathan P. Dowling, "Photonic Band Calculations for Woodpile Structures", *Journal of Modern Optics*, vol. 41, No. 2, Feb. 1994, pp. 2–8 + drawings.

Sözüer, H. Sami and Joseph W. Haus, "Photonic Bands: Simple–Cubic Lattice", *J. Optical Society of America B.*, vol. 10, No. 2, Feb. 1993, pp. 296–302.

Wendt, J.R., G.A. Vawter, P.L. Gourley, T.M. Brennan and B.E. Hammons, "Nanofabrication of Photonic Lattice Structures in GaAs/AlGaAs", *J. Vac. Sci. Technol. B.*, vol. 11, No. 6, Nov./Dec. 1993, pp. 2637–2640.

Yablonovitch, E., T.J. Gmitter and K.M. Leung, "Photonic Band Structure: The Face–Centered–Cubic Case Employing Nonspherical Atoms", *Physical Review Letters*, vol. 67, No. 17, Oct. 21, 1991, pp. 2295–2298.

Hecht, Jeff, "Long–Wavelength Diode Lasers are Tailored for Fiberoptics", *Laser Focus World*, Aug. 1992, pp. 79, 80, 82, 84, 86, 88, 89.

Jewell, Jack L., James P. Harbison and Axel Scherer, "Microlasers", *Scientific American*, Nov. 1991, pp. 86–94.

Lee, T.P., "Diode–Laser Developers Look to Broadband Optical Communications", *Laser Focus World*, Aug. 1989, pp. 129–133.

Meade, Robert D., A. Devenji, J.D. Joannopoulos, O.L. Alerhand, D.A. Smith and K. Kash, "Novel Applications of Photonic Band Gap Materials: Low–Loss Bends and High Q Cavities", *J. Appl. Phys.*, vol. 75, No. 9, May 1, 1994, pp. 4753–4755.

Slusher, R.E., "Semiconductor Microlasers and Their Applications", *Optics & Photonics News*, Feb. 1993, pp. 8–12, 14, 16–17.

RESONANT CAVITIES EMPLOYING TWO DIMENSIONALLY PERIODIC DIELECTRIC MATERIALS

BACKGROUND OF THE INVENTION

The invention is directed to resonant cavities employing two dimensional periodic dielectric materials.

In the past decades, the semiconductor laser has come to play a critical role in numerous applications including optical information storage and retrieval (e.g. CD players), lightwave communication (e.g. optical fibers), and computer input/output. In most commercial applications, these lasers have been of the buried heterostructure or distributed feed back (DFB) varieties. While lasers of this type have been tremendously successful, there have recently been attempts at improving the design of semiconductor lasers to improve efficiency, power output, linewidth, modulation speeds and other device characteristics. In particular, there has been recent success at fabricating vertical cavity surface emitting lasers (VCSELs), microdisk lasers, and even steps toward a photonic band gap (PBG) laser. In each of these systems, the gain is achieved in a similar manner, i.e. by injecting carriers across a p-n junction. However, in each system the cavity in which the lasing occurs is created in a different manner.

In order to put the cavity of the present invention in perspective, it is beneficial to discuss the three conventional cavities which are part of the state of the art. All of the aforementioned cavities have a common feature in that a cavity must have walls along each dimension which reflect electromagnetic radiation. There are two principle ways to reflect light at optical frequencies, total internal reflection (TIR) and reflection from a periodic dielectric structure.

TIR occurs at the interface between two dielectrics when it is not possible to simultaneously match both the frequency and the phase on both sides of the interface. When light is incident from the high dielectric material, it is totally reflected back into the material. This only occurs if the angle of incidence is greater than the critical angle. Light can also be reflected at the interface between a homogeneous dielectric and a periodic dielectric. This occurs when multiple scattered waves in the periodic medium destructively interfere, thereby prohibiting propagation inside the periodic medium.

When a periodic medium forbids the propagation of light, it is said to have a photonic band gap (PBG). It is possible to make PBG structures which reflect light along a single axis (a multilayer film) as described in U.S. patent. application. Ser. No. 08/318,161 entitled "Resonant Microcavities Employing One-Dimensional Periodic Dielectric Waveguides", incorporated herein by reference. It is also possible to make PBG structures which reflect light incident from any arbitrary direction (3-D PBG), as described in U.S. Pat. No. 5,440,421 entitled "Three-Dimensional Periodic Dielectric Structures Having Photonic Bandgaps", also incorporated herein by reference. The present invention relates to PBG structures which reflect light incident in a single plane, thus a two-dimensional PBG.

Figure 1:
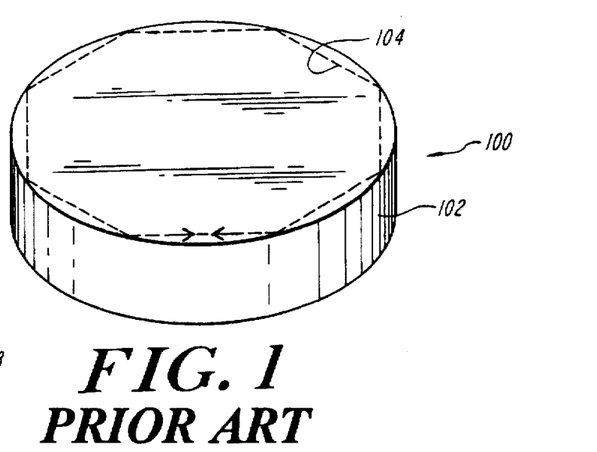

Having identified the two ways to reflect light, it is now possible to review the conventional cavities which are used in semiconductor lasers according to a simple scheme. These cavities are labeled according to how light is reflected along each of the three axes. Consider, for example, microdisk laser 100 shown in FIG. 1. The microdisk is made of a small high-index disk 102 having a gain medium which is made of one or several quantum layers in the center of the disk. The dominant resonant (high-Q) mode 104 is called a whispering-gallery mode since it propagates around the edge of the disk with low losses due to total internal reflection. In this case, the light is totally internally reflected along every axis, and so it is designated T3.

Figure 2:
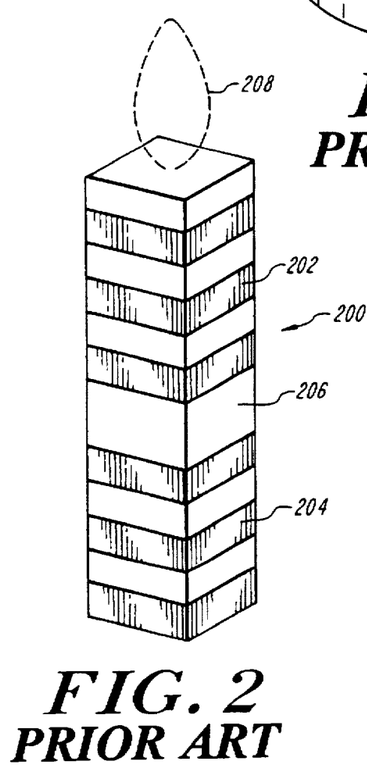
FIG. 2 shows a prior art vertical cavity surface emitting resonant cavity in block diagram form.

The situation is changed when we consider the VCSEL structure 200 of FIG. 2 (or, equivalently, a DFB laser with phase slip). The VCSEL is made of two multilayer dielectric quarter-wave mirrors 202, 204 separated by a cavity 206 having a gain medium of one or several quantum wells. These periodic dielectrics reflect light incident normal to the layers, in the vertical direction. Along the other two directions light is guided along the dielectric-air boundary by TIR and so this construction is labeled as P1T2. In spite of the advantages of the VCSEL over typical semiconductor lasers, the most significant drawback of these devices is their vertical position and vertical emission 208 on the substrate which limits significantly their usefulness in optoelectronic integrated circuits (OEICs).

Figure 3:
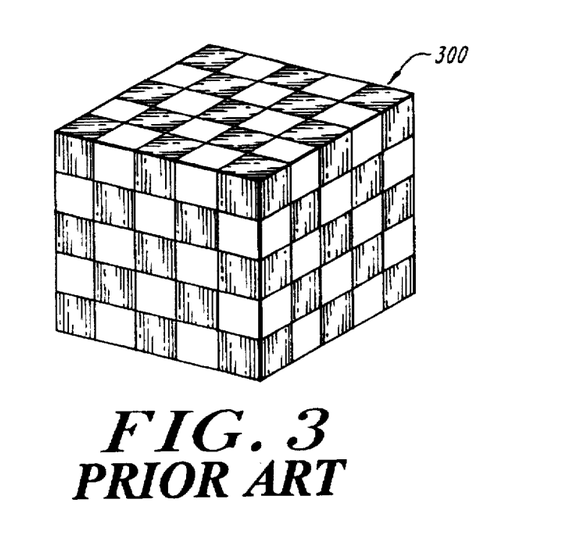
FIG. 3 shows a prior art resonant cavity constructed in a three-dimensional periodic dielectric structure with PBG in block diagram form.

In FIG. 3, a resonant cavity constructed in a threedimensional periodic dielectric structure 300 with PBG is shown. This cavity is surrounded by a dielectric crystal which is periodic along all three directions, thus the periodicity reflects light along all three directions. Such a structure is labeled P3. U.S. Pat. No. 5,187,461 entitled "Low-loss Dielectric Resonator Having a Lattice Structure With a Resonant Defect", incorporated herein by reference, describes a three-dimensional dielectric lattice with a defect.

It is therefore an object of the present invention to provide a new technique of producing high Q resonant cavities. These cavities may be employed in a laser, as filters, or in any other application which requires a resonant cavity.

It is a further object of the present invention to provide a resonant cavity which achieves in-plane (x-y) localization of electromagnetic radiation using a two-dimensional periodic dielectric, and vertical confinement of electromagnetic radiation using TIR. Such a cavity is designated as P2T1 and will work at any frequency between ultraviolet and microwave.

SUMMARY OF THE INVENTION

The present invention provides a resonant cavity including a planar two-dimensional periodic dielectric structure and a defect in the periodic dielectric structure which results in a photonic band gap. The photonic band gap effects an in-plane spacial confinement of electromagnetic radiation generated within the structure. The electromagnetic radiation is vertically confined by total internal reflection.

BRIEF DESCRIPTION OF THE DRAWINGS

FIG. 1 shows a prior art microdisk resonant cavity in block diagram for

DETAILED DESCRIPTION OF THE ILLUSTRATED EMBODIMENTS

Figure 4A:
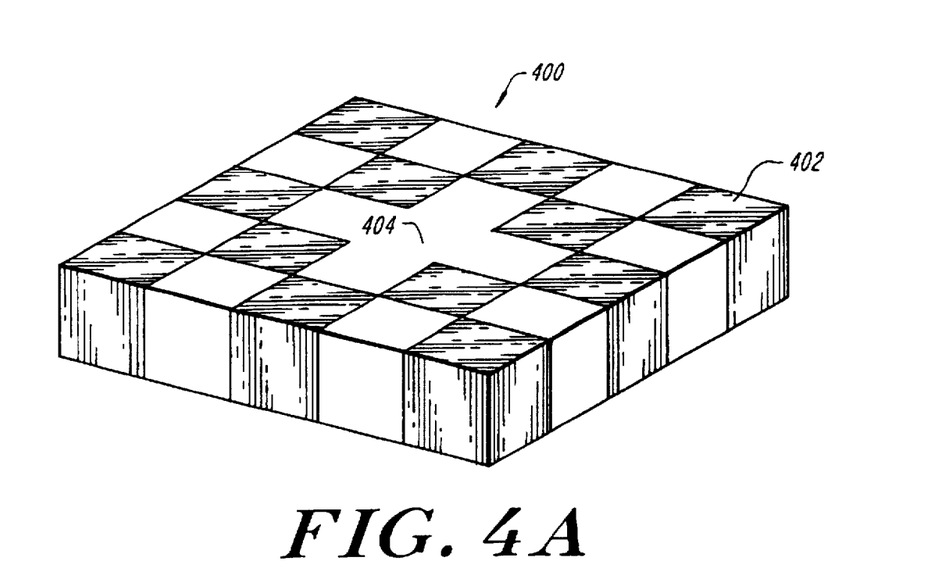
FIGS. 4A and 4B respectively show in block diagram form a resonant cavity constructed in a two-dimensional periodic dielectric structure with a defect and a waveguide in accordance with the present invention.

With reference now to FIG. 4A, a high Q resonant cavity 400 in accordance with the present invention is shown schematically in block diagram form. The cavity 400 is constructed in a two-dimensional periodic dielectric structure 402 having a PBG. As is known in the art, the existence of a PBG results in a range of frequencies where electromagnetic energy is not permitted to exist in the periodic structure. A defect 404 introduced to the structure results in the structure exhibiting an electromagnetic mode within the PBG. Since the mode is not normally allowed within the PBG, the mode exists only localized to the defect. In accordance with the present invention, the mode is confined because the dielectric structure is periodic along two directions, and so it can reflect light if it is propagating in the plane of the underlying substrate. Moreover, the mode is also confined in the vertical direction by TIR. Accordingly, this cavity is classified as P2T1.

Figure 4B:
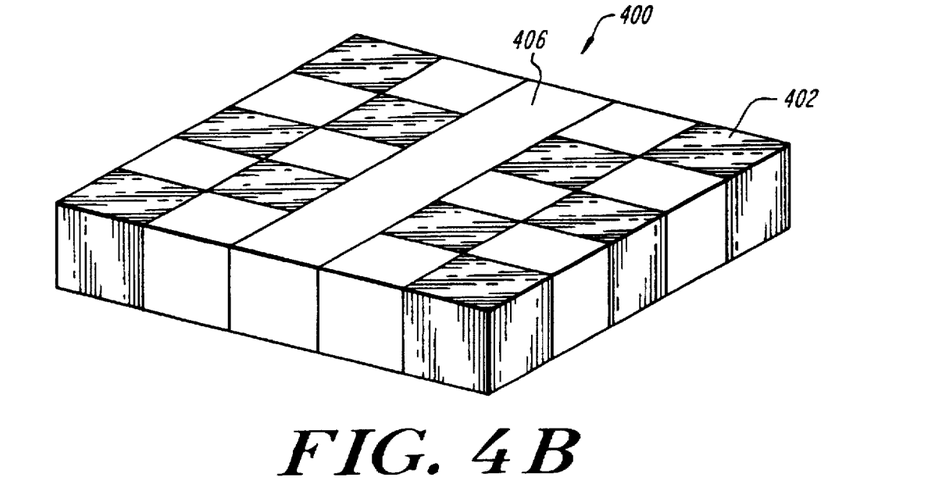

It is understood that the energy developed within the cavity is captured within the cavity. However, the energy leaks out exponentially from the cavity with respect to distance to the cavity. In other words, there is an exponential decay of intensity of the mode into the surrounding regions of the cavity. Accordingly, it is desirable to recapture this escaped energy. If a waveguide is positioned in the vicinity of the cavity, the energy can be recaptured and channeled through the waveguide. FIG. 4B shows a periodic structure with an integrated waveguide 406 which can be used to couple energy out of the cavity. As will be discussed hereinafter, it will be desirable to couple into the cavity using a waveguide in close proximity to the defect. Under these circumstances, the waveguide is a linear defect in an otherwise periodic dielectric structure.

The 2D PBG cavity of the present invention has the two important features of in-plane confinement of light employing a two-dimensional photonic band gap material, and vertical confinement of light via TIR. Each of these features will be discussed in detail hereinafter.

According to the present invention, the in-plane confinement of electromagnetic radiation is achieved employing a two-dimensional periodic dielectric array. Such a structure can be produced with a photonic band gap, which reflects light from all in-plane directions. In particular, square, triangular and honeycomb lattices have adequate electromagnetic properties. Moreover, such dielectric arrays may be constructed, for example, either from air in dielectric as achieved by resonant cavity 500 of FIG. 5, or dielectric in air as achieved by resonant cavities 600 and 700 of FIGS. 6 and 7, respectively. It will be appreciated by those of skill in the art that other configurations of dielectric arrays are possible without the use of air, in particular it is desirable to obtain a structure with sufficient dielectric contrasts. While the subject of two dimensional dielectric lattices has received some attention as reflected in Meade et al., "Novel Applications of Photonic Band Gap Materials: Low-loss Bends and High Q Cavities", incorporated herein by reference, however, in accordance with the present invention, the electromagnetic energy is vertically confined by TIR in a 2D PBG structure.

Figure 8A:
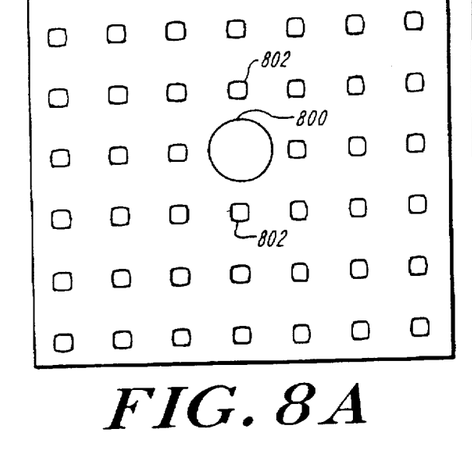
FIGS. 8A and 8B respectively show a schematic of a cavity with a surrounding periodic lattice and a contour plot of associated electric fields of the cavity mode.
Figure 8B:
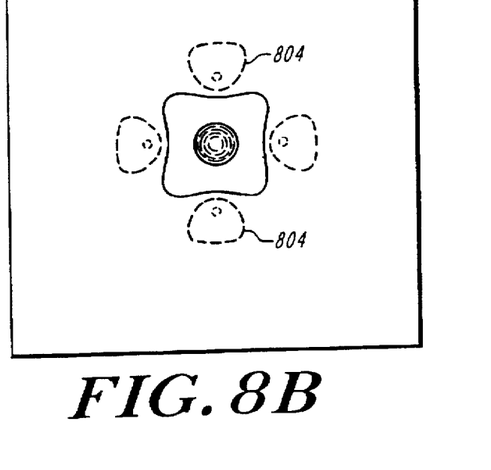
Figure 8C:
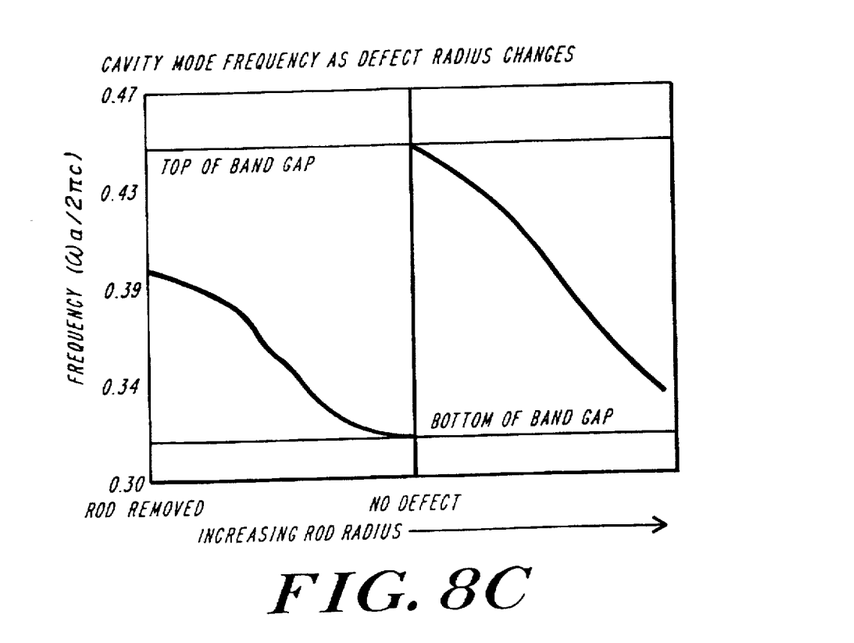
FIG. 8C shows a plot of cavity mode frequency as defect radius changes.

Having created a reflecting two-dimensional dielectric lattice, it is then necessary to embed a defect in this lattice to localize the light. This process is similar in spirit to that described in U.S. Pat. No. 5,187,461 entitled "Low-loss Dielectric Resonator Having a Lattice Structure With a Resonant Defect", incorporated herein by reference, in which a three-dimensional dielectric lattice is created and a defect introduced. In accordance with the present invention, the 2D periodicity is responsible for 2D (in-plane) localization. For example, with reference to FIGS. 8A and 8B, a localized mode created by a cavity 800 surrounded by 2D reflecting walls is shown. In FIG. 8A, the cavity is centrally located with a surrounding periodic lattice 802 of reflecting dielectric. The electric fields 804 associated with the localized cavity mode are shown in the contour plot of FIG. 8B. As in the 3D PGP structure, by varying the defect size the cavity resonance can be tuned to any frequency in the band gap, as shown in the plot of FIG. 8C.

In accordance with the present invention, the vertical confinement of electromagnetic radiation is achieved by creating a high dielectric layer surrounded by layers of lower dielectric constant. With reference back to FIG. 5, one exemplary embodiment of this implementation is shown. The resonant cavity structure 500 includes a layer of material 502 having a predetermined dielectric constant with a periodic array of air holes 504 disposed therethrough. The cavity is formed by breaking the perfect periodicity along the x and y axes, hence forming a local defect 506 which can lead to strong spacial confinement of the radiation around the defect in order to generate an electromagnetic mode. In this embodiment, the TIR occurs between the dielectric material and air on both sides of the cavity.

Figure 5:
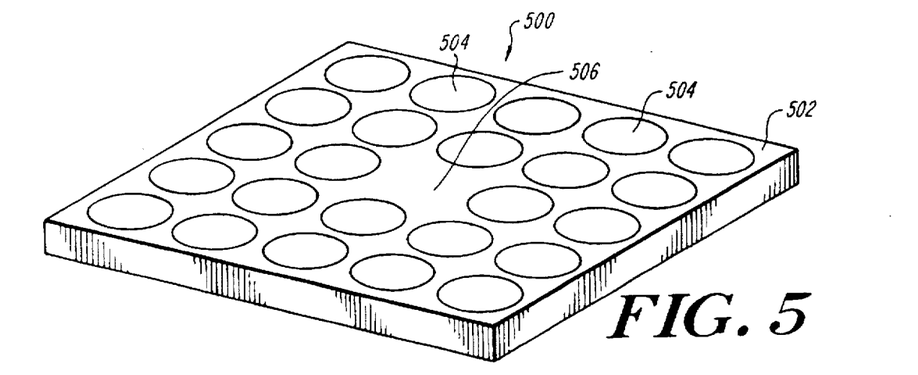
FIG. 5 shows an exemplary embodiment of a resonant cavity configured in a two-dimensional periodic dielectric structure.

A straightforward way to produce the cavity 500 at microwave frequencies is to take a plane of high dielectric material and drill the periodic series of holes with conventional machine tools, thus resulting in the 2D PBG structure. At optical frequencies, such a cavity can be fabricated employing techniques similar to those used to fabricate the microdisk laser. For example, photolithography, x-ray lithography, electron beam lithography, and reactive ion beam etching.

Figure 6:
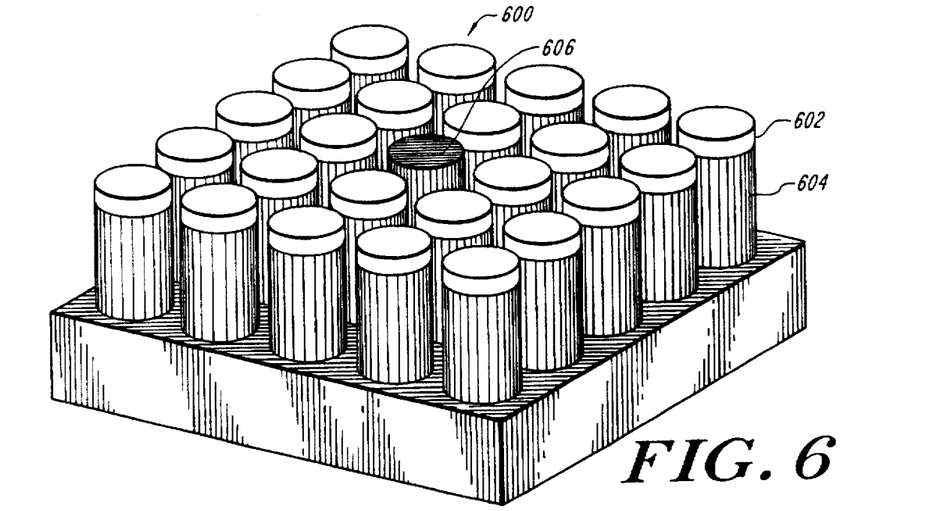
FIG. 6 shows a second exemplary embodiment of a resonant cavity configured in a two-dimensional periodic dielectric structure.

Another exemplary embodiment of a P2T1 cavity 600 is shown in FIG. 6. In this embodiment, a layer 602 of high index material such as GaAs is grown on a low index substrate 604, such as GaAlAs. Thereafter, a periodic series of columns, for example, are formed by etching. A defect 606 is provided at a selected position. The defect is formed, for example, by removing the high index material from a selected column or any other process which would interrupt the periodicity of the surrounding material. The column structures are produced, for example, by utilizing reactive ion beam etching or electron beam lithography. At the top surface, the index contrast between the GaAs and air is large and so the reflections are quite strong, while at the bottom surface the index contrast between the GaAs and GaAlAs is small, thus the reflections are weaker.

Figure 7:
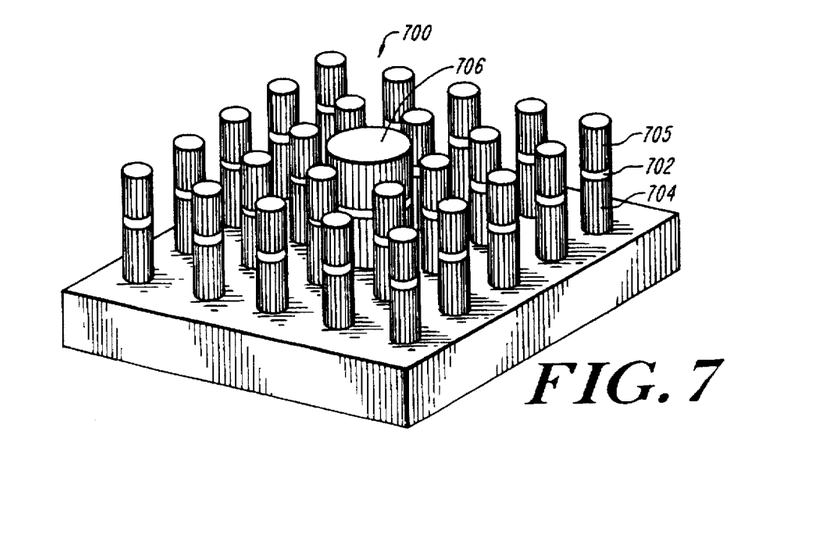
FIG. 7 shows a third exemplary embodiment of a resonant cavity configured in a two-dimensional periodic dielectric structure.

A further exemplary embodiment of a resonant cavity 700 which achieves inplane confinement of electromagnetic radiation is shown in FIG. 7. The cavity 700 includes a high index layer 702 of, for example, GaAs, positioned between lower index material layers 704, 705 such as GaAlAs. Through conventional chemical etching, a periodic array of columns are formed. The defect 706 which breaks the periodicity of the structure in the illustrated example is formed by the creation of an oversized column.

In this embodiment, light is confined to the high index GaAs layer surrounded by low index GaAs on either side. It will be appreciated by those of skill in the art that while the illustrated embodiments are shown utilizing GaAs/eGaAlAs epilayers, in fact any two dielectric materials of differing dielectric constant can be used. For example, an alternative construction can include a layer of GaInAsP between layers of InP.

Figure 9:
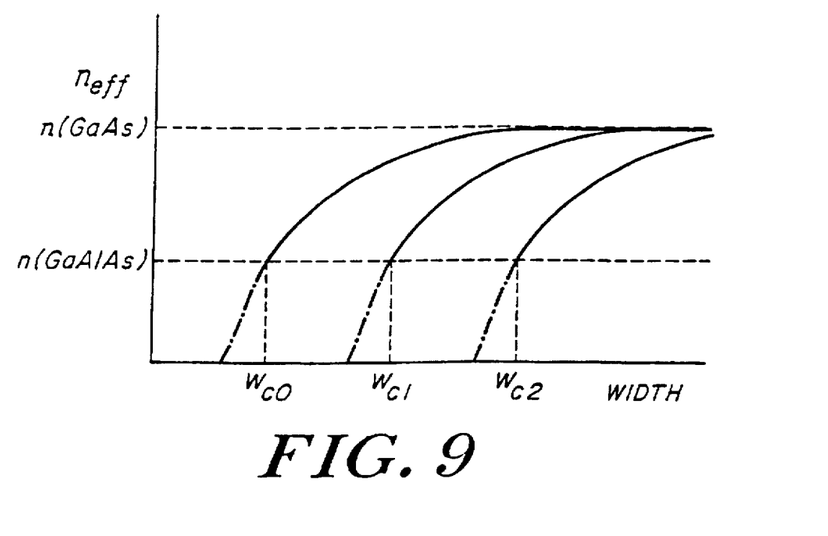
FIG. 9 shows a plot of the effective index of a guided wave versus the width of the guiding layer.
Figure 10A:
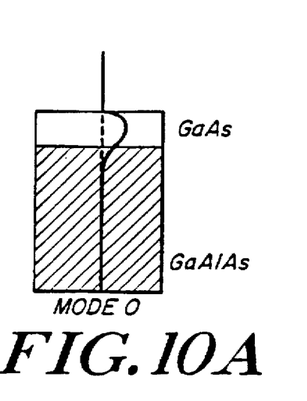
FIGS. 10A–10C show schematic plots of electric field intensity for modes with zero, one and two nodes.
Figure 10B:
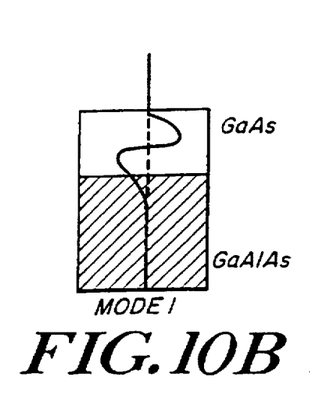
Figure 10C:
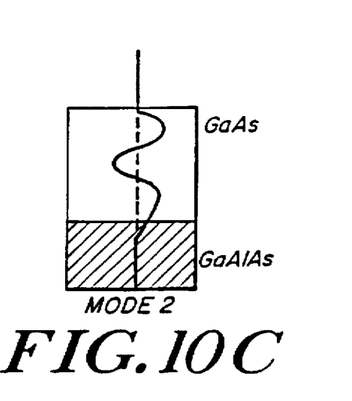

One important aspect of designing a P2T1 cavity in accordance with the present invention is the choice of width of the high dielectric layer, which must be neither too large nor too small. For a laser application, the vertical mode profile at a given frequency $\omega_0$ (the frequency of the cavity mode which is chosen to be the frequency of the laser light) is of the greatest interest. In particular, the dependence of the vertical mode profile with the width of the layer in order to determine the number of guided modes is of interest. This dependence is shown in the graph of FIG. 9, which plots the effective index, $n_{eff}=k/\omega_0$, versus layer width, where k is the wave vector of the propagating mode. This graph shows that there are a number of critical widths $w_{c,n}$ above which a mode with n nodes becomes guided (solid lines) and below which the mode is a resonance (dashed-dotted lines). To create a high-Q cavity, it is important to have exactly one guided mode. If there are no guided modes then there is no high-Q cavity mode. However, if there are several guided modes then there will be several high-Q cavities which may have similar frequencies. Therefore, it is necessary to choose the layer width $w_{c,0}<w<w_{c,1}$. Although the illustrated embodiments are considered with respect to only the simple case of a single layer of high dielectric material in the absence of the 2D PBG, the variation with width has the same qualitative behavior when the 2D PBG is accounted for. FIGS. 10A–10C respectively show electric field intensity schematics for modes with zero, one and two nodes.

Another important aspect of designing a P2T1 cavity in accordance with the present invention is the proper consideration of polarization effects. For simplicity, the difference between polarizations in the description of layer widths is ignored. In fact, the critical widths $w_{c,n}$, of a single layer of high dielectric material is slightly different for TE (E-field parallel to the surface of the substrate) and TM (H-field parallel to the surface of the substrate) modes. This difference is magnified by the presence of the 2D PBG because in this case, the TE and TM modes have very different propagation properties. However, polarization considerations can be dealt with easily by choosing a 2D periodic lattice which has a gap only for either TE or TM modes.

Figure 11:
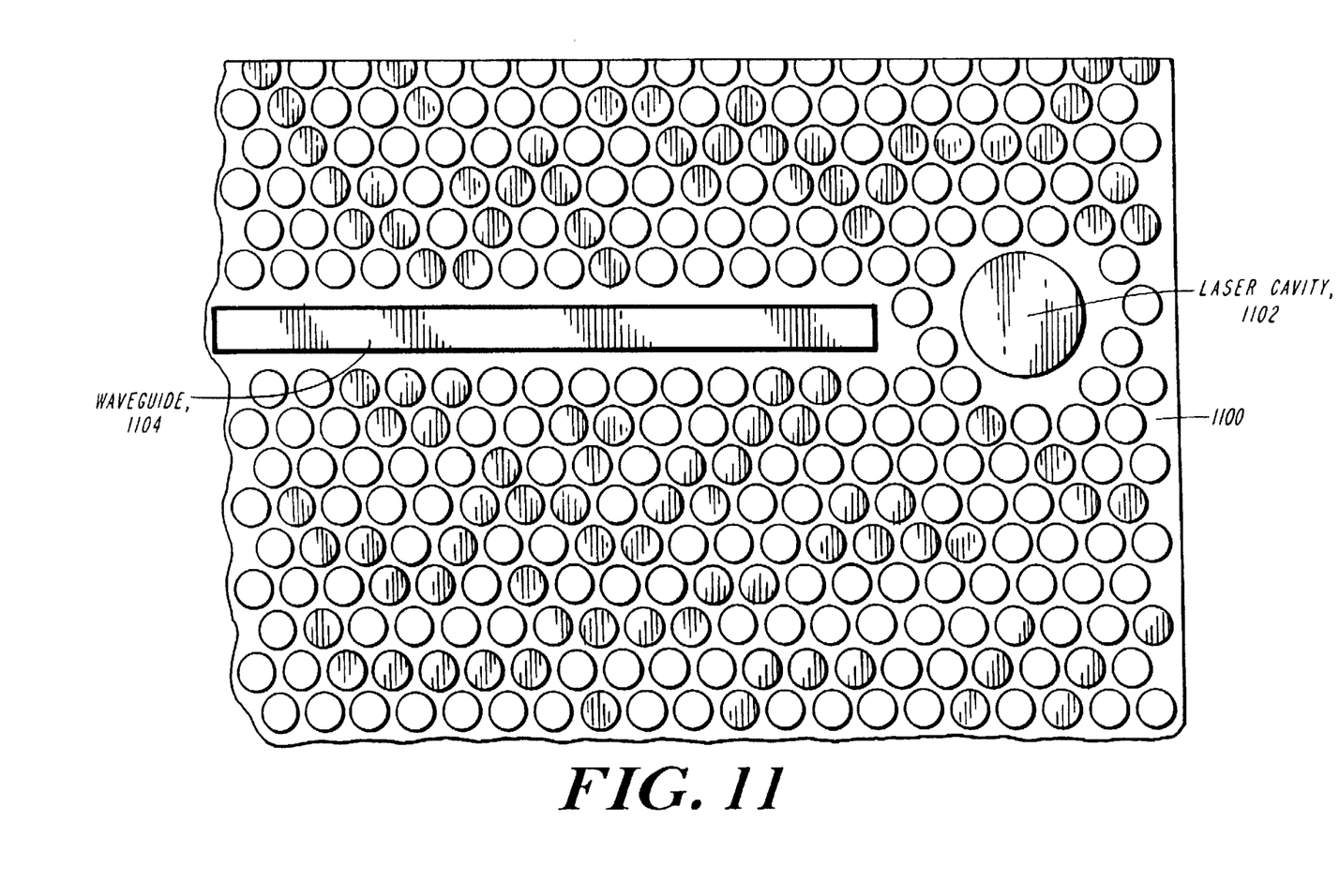
FIG. 11 shows an exemplary construction of a laser cavity configured within a two-dimensional periodic dielectric structure proximate to an integrated waveguide.

One exemplary application of the resonant cavity of the present invention is for the production of semiconductor lasers. The 2D laser geometry is particularly useful for integrated optoelectronics. The utility arises from the ease of coupling the laser light into a nearby inplane waveguide as schematically shown in FIG. 11. FIG. 11 shows a two-dimensional periodic dielectric structure 1100 having laser cavity 1102 in close proximity to a waveguide 1104. Because the dielectric is reflecting, the principle exit port for the electromagnetic radiation is into the waveguide. This configuration eliminates substrate radiation as a source of loss.

Figure 12:
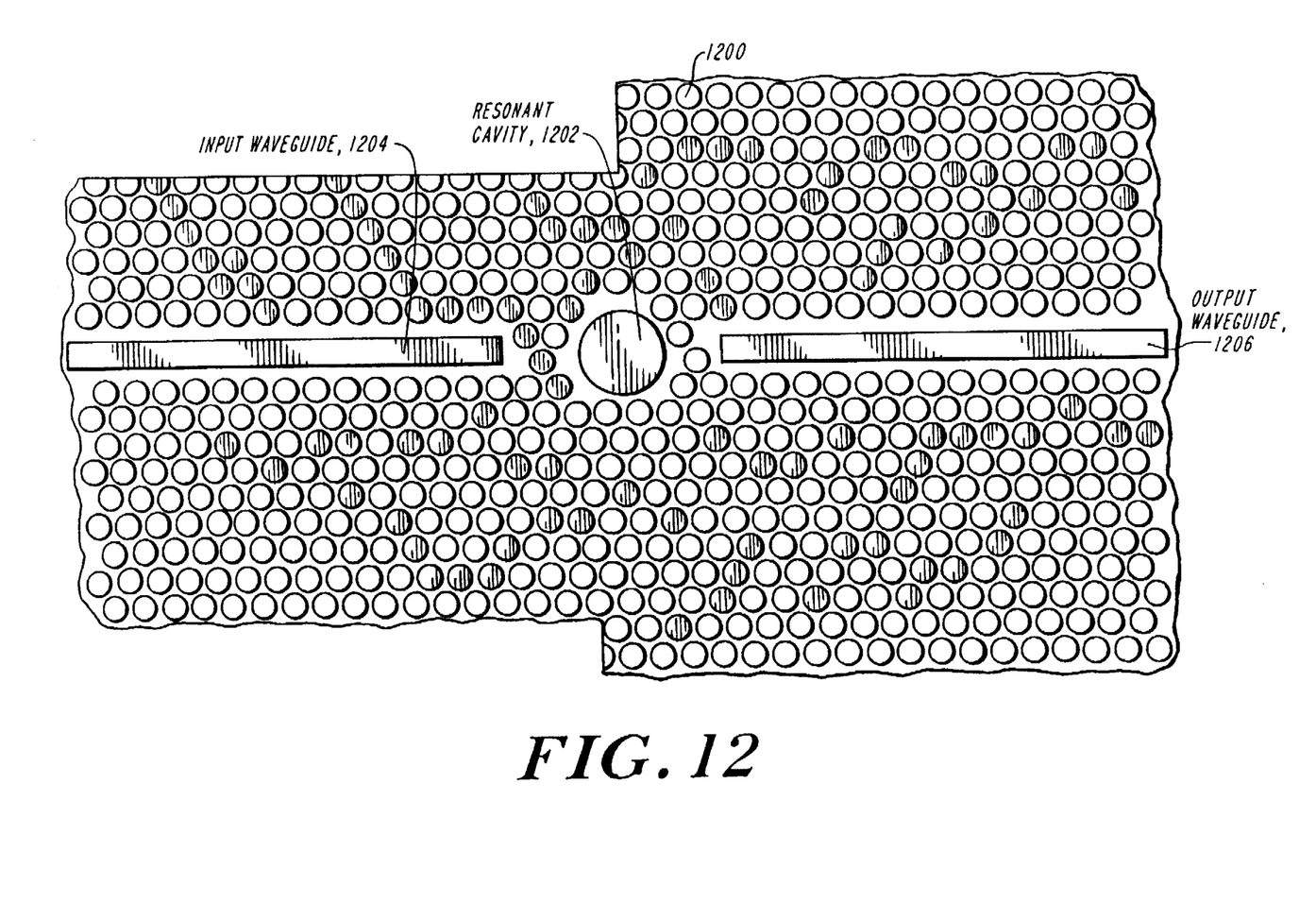
FIG. 12 shows a two-dimensional periodic dielectric structure having a resonant cavity in close proximity to an input waveguide for use as a semiconductor filter in accordance with the present invention.

Another exemplary application of the resonant cavity of the present invention is for use in semiconductor device filters. The 2D geometry is also particularly useful for integrated optoelectronics. The utility similarly arises from the ease of coupling electromagnetic energy into and out of a resonant cavity as schematically shown in FIG. 12. FIG. 12 shows a two-dimensional periodic dielectric structure 1200 having a resonant cavity 1202 in close proximity to an input waveguide 1204. Accordingly, electromagnetic energy can be transported to the resonant cavity to induce the generation of further electromagnetic energy. Thereafter, because the dielectric is reflecting, the principle exit port for the electromagnetic radiation generated by the cavity is into an output waveguide 1206. This configuration can operate as a filter by designing the cavity to include a defect which creates a desired electromagnetic mode, thus only specified portions of the generated electromagnetic energy are allowed to pass through to the output waveguide. It will be appreciated that the embodiment of FIG. 12 can be modified to include one or more input waveguides as well as one or more output waveguides, depending on the desired filtering operation.

The foregoing description has been set forth to illustrate the invention and is not intended to be limiting. Since modifications of the described embodiments incorporating the spirit and substance of the invention may occur to persons skilled in the art, the scope of the invention should be limited solely with reference to the appended claims and equivalents thereof.

What is claimed is:

1. A resonant cavity comprising:
   a planar two-dimensionally periodic dielectric structure which exhibits a two-dimensional photonic bandgap for propagation of radiation having a spectrum of electromagnetic modes in any direction in the plane of said structure; and
   a defect in said two-dimensionally periodic dielectric structure which results in an electromagnetic mode localized in the vicinity of said defect within said photonic bandgap, wherein
   said photonic bandgap effects an in-plane spacial confinement of electromagnetic radiation for any direction of propagation of said electromagnetic radiation in the plane of said structure, said electromagnetic radiation being vertically confined by total internal reflection.

2. The resonant cavity of claim 1, wherein a waveguide is provided within said two-dimensionally periodic dielectric structure in the proximity of said defect.

3. The resonant cavity of claim 2, wherein said waveguide is supported by a substrate, said substrate providing a refractive index contrast with said waveguide.

4. The resonant cavity of claim 1, wherein said structure comprises a two-dimensional array of holes provided therein for periodicity.

5. The resonant cavity of claim 4, wherein said local defect comprises a region in which at least one of said holes is varied in size with respect to the remaining holes in said array.

6. The resonant cavity of claim 1, wherein said structure comprises an array of rods extending therefrom for periodicity.

7. The resonant cavity of claim 6, wherein said defect comprises a region in which at least one of said rods is varied in size or dielectric constant with respect to the remaining rods in said array.

8. The resonant cavity of claim 7, wherein each of said array of rods includes a first portion comprising a material having a first dielectric constant and a second portion comprising a material having a differing second dielectric constant.

9. A resonant cavity which exhibits an electromagnetic mode for use in a microlaser, comprising:

a planar two-dimensionally periodic dielectric structure which exhibits a two-dimensional photonic bandgap for propagation of radiation having a spectrum of electromagnetic modes in any direction in the plane of said structure, said structure vertically confines radiation by total internal reflection; and a local defect disposed in said two-dimensionally periodic dielectric structure which results in an electromagnetic mode localized in the vicinity of said defect, said local defect accommodating an in-plane spacial confinement of said radiation for any direction of propagation of said radiation in the plane of said structure.

10. The resonant cavity of claim 9, wherein a waveguide is provided within said two-dimensionally periodic dielectric structure in the proximity to said defect.

11. The resonant cavity of claim 10, wherein said waveguide is supported by a substrate, said substrate providing a refractive index contrast with said waveguide.

12. The resonant cavity of claim 9, wherein said structure comprises an array of holes provided therein for periodicity.

13. The resonant cavity of claim 12, wherein said defect comprises a region in which at least one of said holes is varied in size with respect to the remaining holes in said array.

14. The resonant cavity of claim 9, wherein said structure comprises an array of rods extending therefrom for periodicity.

15. The resonant cavity of claim 14, wherein said defect comprises a region in which at least one of said rods is varied in size or dielectric constant with respect to the remaining rods in said array.

16. The resonant cavity of claim 15, wherein each of said array of rods includes a first portion comprising a material having a first dielectric constant and a second portion comprising a material having a differing second dielectric constant.

17. A method of producing a resonant cavity with enhanced radiation confinement, comprising:

providing a substrate;

forming a planar two-dimensionally periodic dielectric structure which exhibits a two-dimensional photonic bandgap on said substrate, said photonic band gap effecting an in-plane spacial confinement of electromagnetic radiation for any direction of propagation of said electromagnetic radiation in the plane of said structure, said electromagnetic radiation being vertically confined by total internal reflection and forming a defect in said two-dimensionally periodic structure which results in an electromagnetic mode within said photonic bandgap, and which accommodates spacial confinement of radiation generated within said structure.

18. A device comprising:

a resonant cavity including a planar two-dimensionally periodic dielectric structure which exhibits a two-dimensional photonic bandgap, and a defect in said structure which results in an electromagnetic mode localized in the vicinity of said defect within said photonic bandgap, wherein said photonic band gap effects an in-plane spacial confinement of electromagnetic radiation for any direction of propagation of said electromagnetic radiation in the plane of said structure, said electromagnetic radiation being vertically confined by total internal reflection; and a waveguide integrated within said two-dimensionally periodic dielectric structure in the proximity of said defect, said waveguide serving to channel portions of said electromagnetic radiation generated by said resonant cavity.

19. The device of claim 18, wherein at least one additional waveguide is integrated within said structure in the proximity of said defect.

20. A resonant cavity device for use in a filter, comprising:

a resonant cavity including a planar two-dimensionally periodic dielectric structure which exhibits a two-dimensional photonic bandgap, and a defect in said structure which results in an electromagnetic mode localized in the vicinity of said defect within said photonic bandgap, wherein said photonic bandgap effects an in-plane spacial confinement of electromagnetic radiation for any direction of propagation of said electromagnetic radiation in the plane of said structure, said electromagnetic radiation being vertically confined by total internal reflection; and a first waveguide integrated within said two-dimensinally periodic dielectric structure in the proximity of said defect, said first waveguide serving to channel portions of said electromagnetic radiation generated by said resonant cavity; and a second waveguide integrated within said two-dimensionally periodic dielectric structure in the proximity of said defect, said second waveguide serving to channel electromagnetic radiation into said resonant cavity.

* * * * *